United States Patent
Hsieh

(10) Patent No.: US 12,230,705 B2
(45) Date of Patent: Feb. 18, 2025

(54) SHIELDED GATE TRENCH MOSFETS WITH IMPROVED TRENCH TERMINATIONS AND SHIELDED GATE TRENCH CONTACTS

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 387 days.

(21) Appl. No.: 17/729,460

(22) Filed: Apr. 26, 2022

(65) Prior Publication Data

US 2023/0343866 A1    Oct. 26, 2023

(51) Int. Cl.
| | |
|---|---|
| *H01L 29/78* | (2006.01) |
| *H01L 29/06* | (2006.01) |
| *H01L 29/10* | (2006.01) |
| *H01L 29/40* | (2006.01) |

(52) U.S. Cl.
CPC ...... *H01L 29/7811* (2013.01); *H01L 29/0638* (2013.01); *H01L 29/1095* (2013.01); *H01L 29/407* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 7,768,064 B2 | 8/2010 | Sapp et al. | |
| 9,299,776 B2* | 3/2016 | Grivna | H01L 29/407 |
| 9,515,178 B1 | 12/2016 | Qin et al. | |
| 9,748,329 B2* | 8/2017 | Yedinak | H01L 29/0634 |
| 2015/0108569 A1* | 4/2015 | Grivna | H01L 29/0615 |
| | | | 257/334 |
| 2015/0206937 A1* | 7/2015 | Yedinak | H01L 29/8725 |
| | | | 257/334 |

* cited by examiner

*Primary Examiner* — Nduka E Ojeh
(74) *Attorney, Agent, or Firm* — BACON & THOMAS, PLLC

(57) ABSTRACT

Shielded gate trench MOSFETs with gate trenches separated from termination trenches are disclosed, wherein the termination trenches surrounds outer periphery of gate trenches and do not surround said gate metal pad area; Inner edges of a first termination trench of the termination trenches adjacent to trench ends of the gate trenches have a plurality of wave shape portions in regions between two adjacent trench ends of the gate trenches while outer edges have a straight shape to reduce drain-source leakage current. Each of gate trenches on which has at least one shielded gate trench contact connected to a shielded gate electrode, and the shielded gate trench contact is spaced apart from any of multiple gate metal runners with a distance larger than 100 um.

20 Claims, 16 Drawing Sheets

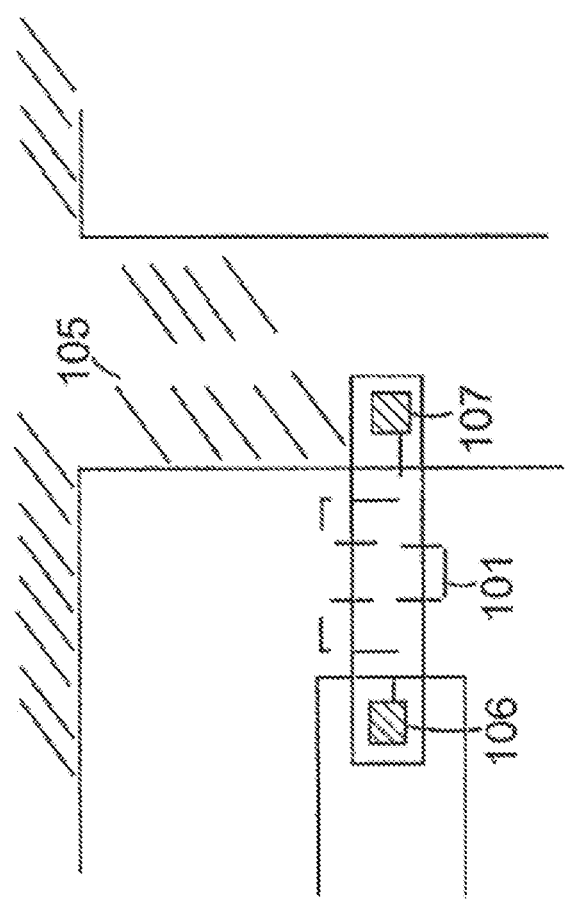

SHIELDED GATE TRENCH MOSFETS WITH IMPROVED TRENCH TERMINATIONS AND SHIELDED GATE TRENCH CONTACTS

FIELD OF THE INVENTION

This invention relates generally to a shielded gate trench (SGT) MOSFET (Metal Oxide Semiconductor Field Effect Transistor) having a wave shape trench design in a first termination trench to reduce electric fields between gate trenches and termination trenches, and a shielded gate trench contact on each of the gate trenches spaced apart from gate metal runners with an optimized distance for high frequency applications.

BACKGROUND OF THE INVENTION

FIG. 1A shows a prior art disclosed in U.S. Pat. No. 9,515,178 which has a single trench termination 104 in connection with multiple gate trenches 102 and across over a gate metal pad 132. Early avalanche occurring at intersection of the single termination trench and the gate trenches is observed for medium voltage shielded gate trench MOSFETs with breakdown voltages ranging from 60-300V. Moreover, device ruggedness is also degraded because the single termination trench passes through the gate metal pad where does not have body contacts 118 under source metal 120.

FIG. 1B shows a prior art disclosed in U.S. Pat. No. 9,299,776 which has a single trench termination 203 separated from gate trenches 202. Inner and outer edges of the single trench termination 203 have a non-linear shape to suppress an electric field at a region between the trench ends of two adjacent gate trenches. However, the single termination trench is not sufficient to meet a requirement that breakdown voltage in a termination area must be higher than an active area for better avalanche capability. Besides, the prior art of U.S. Pat. No. 9,299,776 does not disclose the design configuration in gate metal pad area.

For high-frequency applications, shielded gate resistance Rs plays an important role on reverse recovery time Trr of a parasitic body diode and switching voltage Vsw of drain-source. The higher the shielded gate resistance Rs, the lower the Trr and Vsw. However, if Rs is too high, breakdown voltage becomes unstable. An optimized Rs is needed to be found.

FIG. 1C shows a shielded gate trench MOSFET 100 disclosed in prior art U.S. Pat. No. 7,768,064 comprising a resistive element 101 between shielded gate 102 and source metal for reduction of the reverse recovery charge Qrr of a parasitic body diode in the shielded gate trench MOSFET 100. Besides, the shielded gate trench MOSFET 100 further comprises: a planar source-body contact to contact n+ source region 103 and P body region 104 with the source metal 105; and a p+ ohmic body contact doped region 106 to reduce the contact resistance between the source metal 105 and the P body region 104.

From FIG. 1D which is a top view of the shielded gate trench MOSFET 100 shown in FIG. 1C it can be seen that, the resistive element 101 (illustrated by dash lines) is placed between end contacts 106 and 107, wherein the end contact 106 is connected to the shielded gate 102 (as shown in FIG. 1C) while the end contact 107 is connected to the source metal 105. However, the implementation of the resistive element 101 will need additional cost such as additional mask for a poly-silicon resistor.

Therefore, there is still a need to provide new device configurations such that above discussed problems and limitations can be resolved.

SUMMARY OF THE INVENTION

The present invention provides new SGT MOSFETs with improved trench termination and gate trenches being separated from termination trenches, wherein the termination trenches surrounds outer periphery of the gate trenches and do not surround the gate metal pad area; Inner edges of a first termination trench of the termination trenches adjacent to trench ends of the gate trenches have a plurality of wave shape portions in regions between two adjacent trench ends of the gate trenches while outer edges have a straight shape to reduce drain-source leakage current.

The specific on-resistance can be further reduced with combination of the multiple stepped epitaxial (MSE) structure and multiple stepped oxide (MSO) structure. The MSO structure is a field plate oxide surrounding a shielded gate electrode in a gate trench having multiple stepped oxide with varying thickness decreasing stepwise in a direction from a bottom of the gate trench to a body region, wherein each stepped oxide is uniform.

According to one aspect, the invention features a SGT device comprising: an active area, a termination area, a gate metal pad area and at least one gate metal runner, the active area comprises a plurality of gate trenches formed in an epitaxial layer of a first conductivity type onto a substrate of the first conductivity type along a first axis including a first type active trench having a first trench length, and a second type active trench near the gate pad area having a second trench length, wherein the first type active trench length is longer than the second type active trench length, and the second type active trench does not locate under the gate pad area; the termination area comprises multiple termination trenches surrounding outer periphery of the gate trenches in a first direction along the first axis and in a second direction along a second axis wherein the first axis is vertical to the second axis, and the multiple termination trenches are separated from the gate trenches and do not surround the gate pad area; inner edges of a first termination trench of the termination trenches along the second axis adjacent to trench ends of the gate trenches have a plurality of wave shape portions in regions between two adjacent trench ends of the gate trenches while outer edges have a straight shape, and inner and outer edges of other termination trenches have a straight shape; the first type active trench near the gate metal pad area has at least one wave shape portion in a region between a trench end of the second type active trench adjacent to the first type active trench and the first termination trench near one corner of the gate metal pad area; and the SGT device further comprising, gate trenches formed in the active area, surrounded by source regions of a first conductivity type are encompassed in body regions of a second conductivity type near a top surface of an epitaxial layer of the first conductivity type, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an (Inter-Poly Oxide) IPO film, the gate oxide surrounds the gate electrode and has less thickness than the first insulating film, and a trench field plate is disposed in each of the termination trenches and insulated from the epitaxial layer by a second insulating film, wherein each of the termination trenches has a trench width and a trench depth greater than or equal to each of the gate trenches in the active area.

According to another aspect, in some preferred embodiments, a shielded gate spreading resistance replaces the resistive element in the prior art U.S. Pat. No. 7,768,064 by disposition of shielded gate trench contacts in a region spaced apart from the gate metal runner with an optimized distance. Therefore, no additional cost will be added and no any drawback are introduced.

According to another aspect, in some preferred embodiments, each of the gate trenches has at least one shielded gate trench contact, and the shielded gate trench contact is not formed in an area adjacent to any of the gate metal runners. In some other preferred embodiments, each of the gate trenches has multiple shielded gate trench contacts and at least one gate trench contact.

According to another aspect, in some preferred embodiments, the epitaxial layer has MSE layers with different doping concentration.

According to another aspect, in some preferred embodiments, the SGT device further comprises a channel stop region in the termination area.

According to another aspect, in some preferred embodiments, the gate electrode is disposed above the shielded gate electrode. In some other preferred embodiments, the shielded electrode is disposed in the middle and the gate electrode is disposed surrounding upper portion of the shielded electrode.

According to another aspect, in some preferred embodiments, the wave shape portions have one of triangle or rectangle or semicircle like shapes.

According to another aspect, in some preferred embodiments, each of the gate trenches has a rectangle shape. In some other preferred embodiments, each of the gate trenches has a stripe shape with truncated corners. In some other preferred embodiments, each of the gate trenches has a stripe shape with rounded ends.

According to another aspect, in some preferred embodiments, a first distance between trench end corners of the gate trenches and peaks of the wave shape portions are substantially same as a second distance between trench ends of the gate trenches and bottoms of the wave shape portions, and the first distance is equal to or less than a third distance between two adjacent of the gate trenches. In some other preferred embodiments, a first distance between peaks of the wave shape portions on inner edge of the first type active trench and a trench end corner of the second type active trench near the gate metal pad area, is substantially same as a second distance between peaks of the wave shape portions on inner edge of the first type active trench and a trench corner of the first termination trench near the gate metal pad area, and the first distance is equal to or less than a third distance between two adjacent of the gate trenches. In some other preferred embodiments, the inner edge of termination trench has a truncated corner at intersection of the first direction and the second direction, wherein a first distance between trench end corner of the gate trenches and the truncated corner is substantially same as a second distance between the trench end and bottom of the wave shape portions, and the first distance is equal to or less than a third distance between two adjacent of the gate trenches.

According to another aspect, in some preferred embodiments, the first insulating film is a single oxide film having uniform thickness. In some other preferred embodiments, the first insulating film has MSO structure with thickness decreasing stepwise in a direction from bottoms of the gate trenches to the body regions along sidewalls of said gate trenches.

According to another aspect, the present invention also features a SGT device comprising: an active area, a termination area and a gate metal pad area; the active area comprises a plurality of gate trenches formed in an epitaxial layer of a first conductivity type onto a substrate of the first conductivity type along a first axis including a first type active trench having a first trench length, and a second type active trench near the gate pad area having a second trench length, wherein the first type active trench length is longer than the second type active trench length, and the second type active trench does not locate under the gate metal pad area; the termination area comprises at least one termination trench surrounding outer periphery of the gate trenches in a first direction along the first axis and in a second direction along a second axis wherein the first axis is vertical to the second axis, and the first type termination trench is separated from the gate trenches and does not surround the gate metal pad area; the termination area further comprises at least one second type termination trench surrounding the first type termination trench and at least portion of the gate metal pad area; inner edges of a first termination trench of the termination trenches along the second axis adjacent to trench ends of the gate trenches have a plurality of wave shape portions in regions between two adjacent trench ends of the gate trenches while outer edges have a straight shape, and inner and outer edges of other termination trenches have a straight shape; and the first type active trench near the gate metal pad area has at least one wave shape portion in a region between a trench end of the second type active trench adjacent to the first type active trench and the first termination trench near one corner of the gate metal pad area.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description to explain the principles of the invention. In the drawings:

FIG. 1D is a top view of the SGT MOSFET shown in FIG. 1C.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top". "bottom". "front". "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
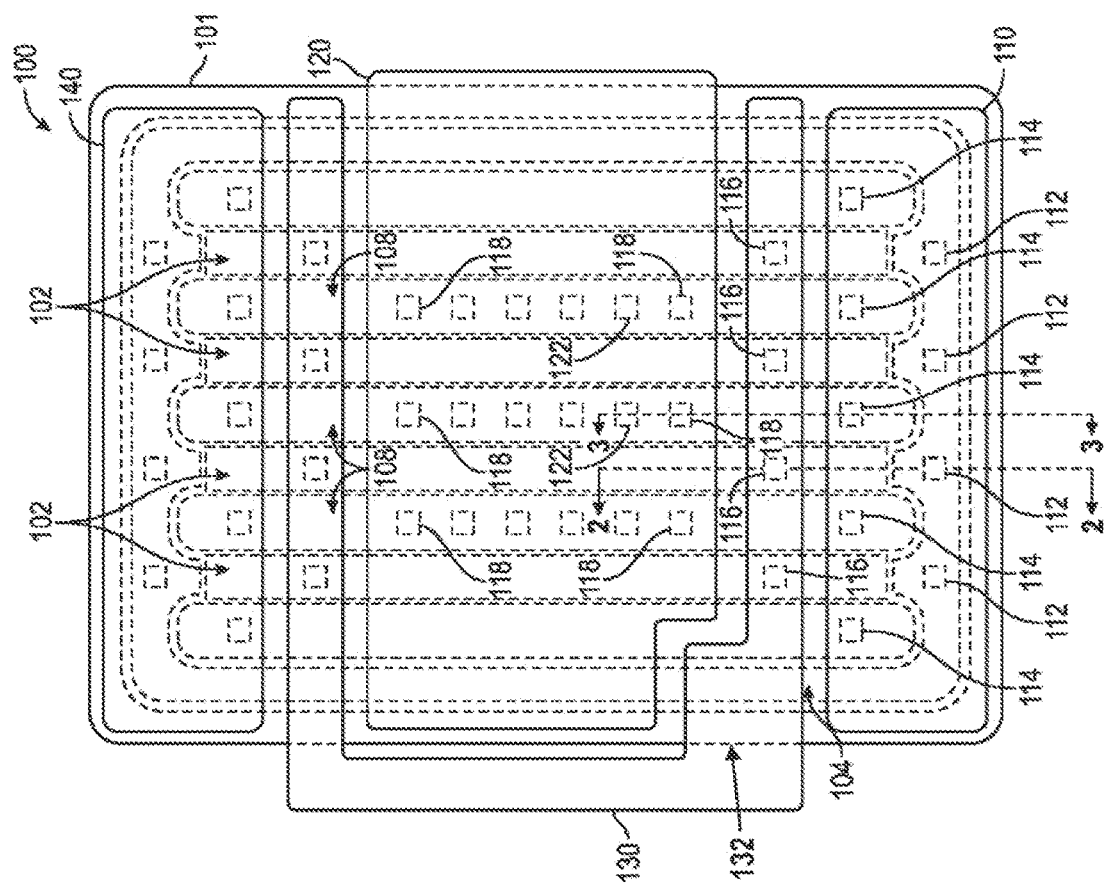
FIG. 1A is a top view of a SGT MOSFET of prior art.
Figure 1B:
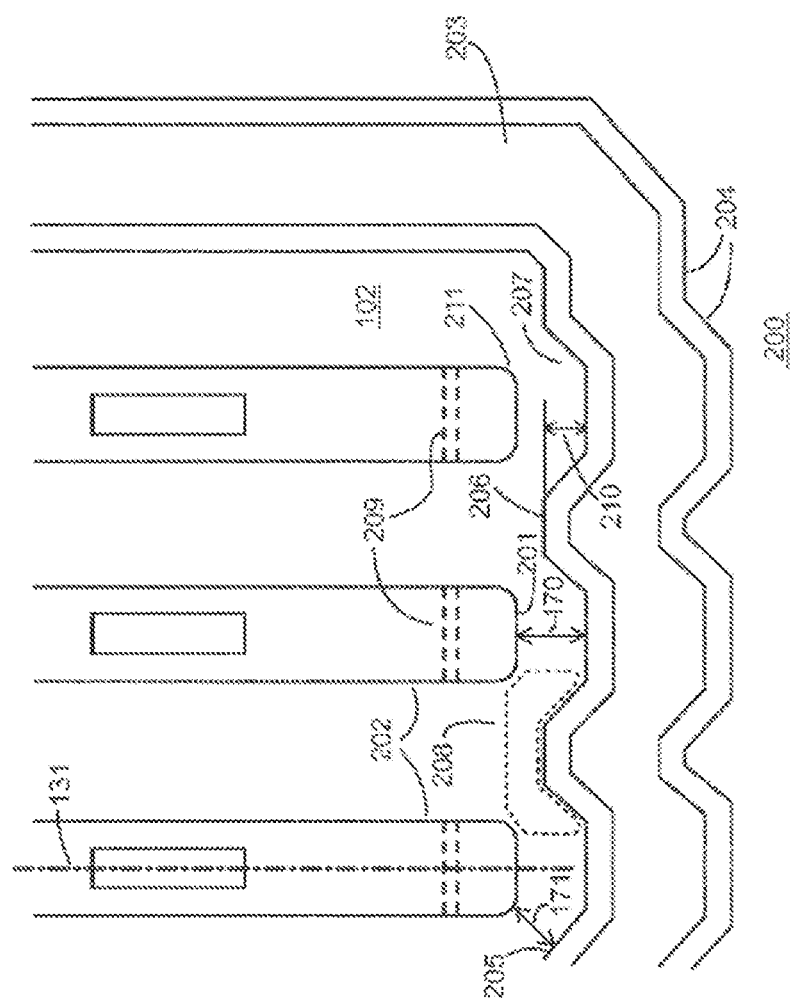
FIG. 1B is a cross-sectional view of another SGT MOSFET of prior art.
Figure 1C:
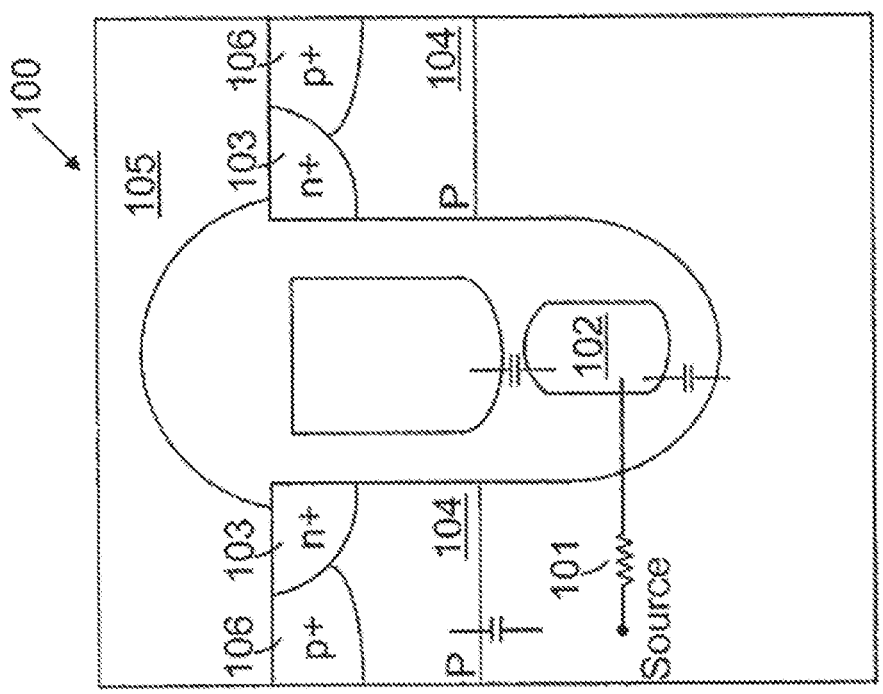
FIG. 1C is a cross-sectional view of another SGT MOSFET of prior art.
Figure 2A:
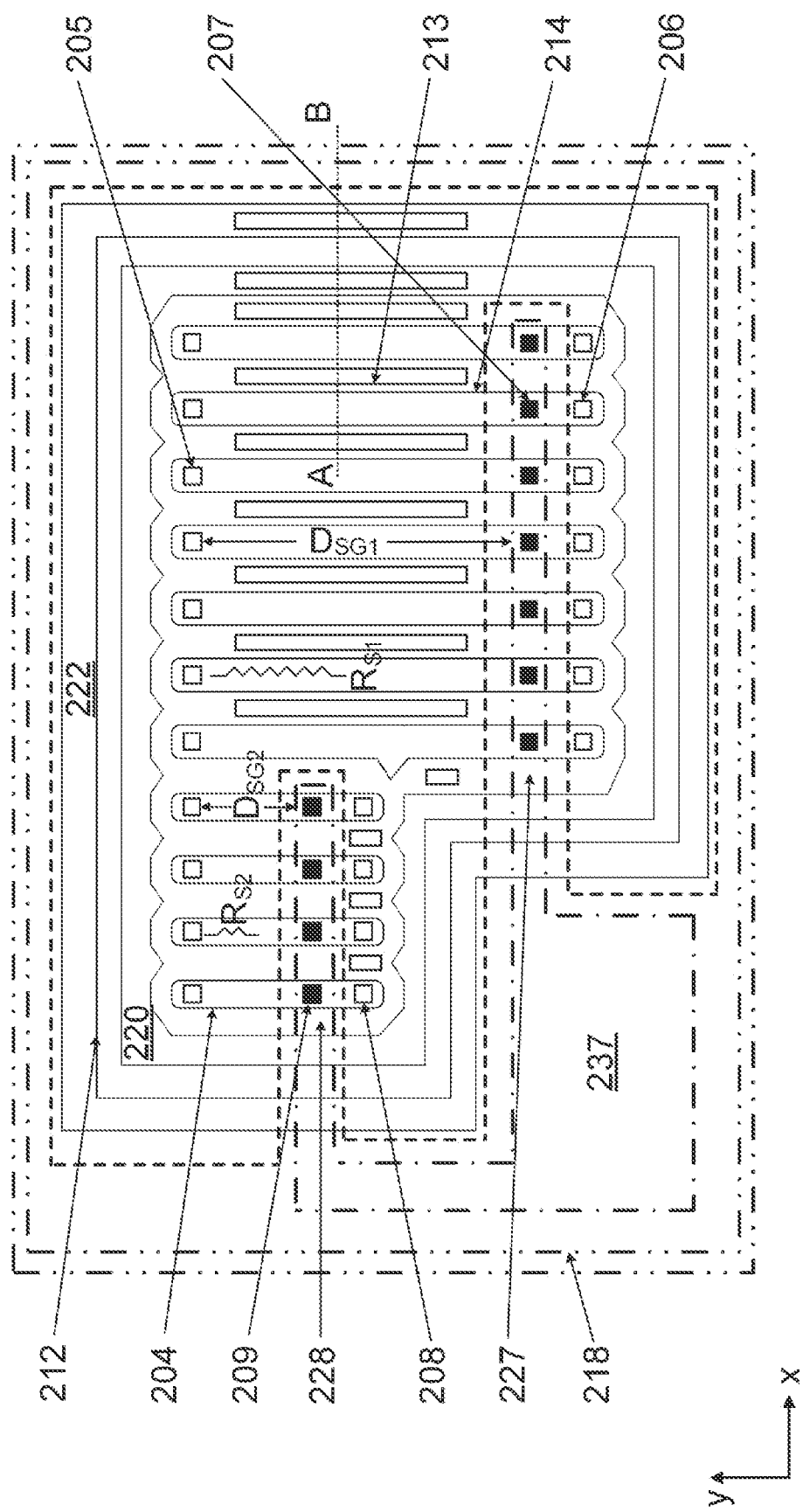
FIG. 2A is a top view of a preferred embodiment for a SGT MOSFET according to the present invention.

Please refer to FIG. 2A for a top view of a preferred embodiment for a SGT semiconductor power device according to the present invention, wherein the SGT semiconductor power device comprises an active area, a termination area, a gate metal pad area 237 and two gate metal runners 227 and 228. In the active area, a plurality of the first type active trenches 214 and the second type active trenches 204 are formed in an N type epitaxial layer onto a N+ substrate along a first axis direction (the y reference direction), wherein the length of the first type active trench 214 is longer than that of the second type active trench 204, and the second type active trenches 204 locate above the gate metal pad area 237. On each of the first type active trenches 214, a top shielded gate trench contact 205, a bottom shielded gate trench contact 206 and one gate trench contact 207 in the vicinity of the bottom shielded gate trench contact 206 are formed while on each of the first type active trenches 204, a top shielded gate trench contact 205 and a bottom shielded gate trench contact 208 and one gate trench contact 209 in the vicinity of the bottom shielded gate trench contact 208 are formed. The top shielded gate trench contacts 205 locate in a region spaced apart from the gate metal runners 227 and 228 with a distance ($D_{SG1}$ and $D_{SG2}$, as illustrated) while shielded gate trench contacts 206 and 208 locate in the vicinity of gate metal runners 227 and 228 respectively. In the termination area, multiple termination trenches including the first termination trench 220 and the second termination trench 222 are formed surrounding outer periphery of the first type active gate trenches 214 and second type active gate trenches 204 in a first direction along the first axis direction (the y reference direction) and in a second direction along a second axis direction (the x reference direction) wherein the first axis is vertical to the second axis, and the multiple termination trenches are separated from the gate trenches 214 and 204 and do not surround the gate metal pad area 237. Inner edges of the first termination trench 220 along the second axis direction (the x reference direction) adjacent to trench ends of the gate trenches 214 and 204 have a plurality of wave shape portions in regions between two adjacent trench ends of the gate trenches 214 and 204 while outer edges have a straight shape, and inner and outer edges of other termination trenches have a straight shape. The first type active trench 214 near the gate metal pad area 237 has at least one wave shape portion in a region between a trench end of the second type active trench 204 adjacent to the first type active trench 214 and the first termination trench 220 near one corner of the gate metal pad area 237. A source metal 212 connecting to a plurality of source trench contacts 213, and a channel stop metal 218 in the termination area are formed. Moreover, a shielded gate electrode inside each of the first type active trenches 214 is connected to the source metal 212 with a built-in shielded gate spreading resistance (Rs1, as illustrated) through the top shielded gate trench contact 205 and the bottom shielded gate trench contacts 206 while a shielded electrode inside each of the second type active trenches 204 is connected to the source metal 212 with a built-in shielded gate spreading resistance (Rs2, as illustrated) through the top shielded gate trench contact 205 and the bottom shielded gate trench contacts 208 for reduction of the reverse recovery charge Qrr of a parasitic body diode and the switching voltage Vsw in the SGT device. The top shielded gate trench contacts 205 are spaced apart from the gate metal runners 227 and 228 with a distance ($D_{SG1}$ and $D_{SG2}$, as illustrated) ranging from 100 um to 3000 um, respectively.

Figure 2B:
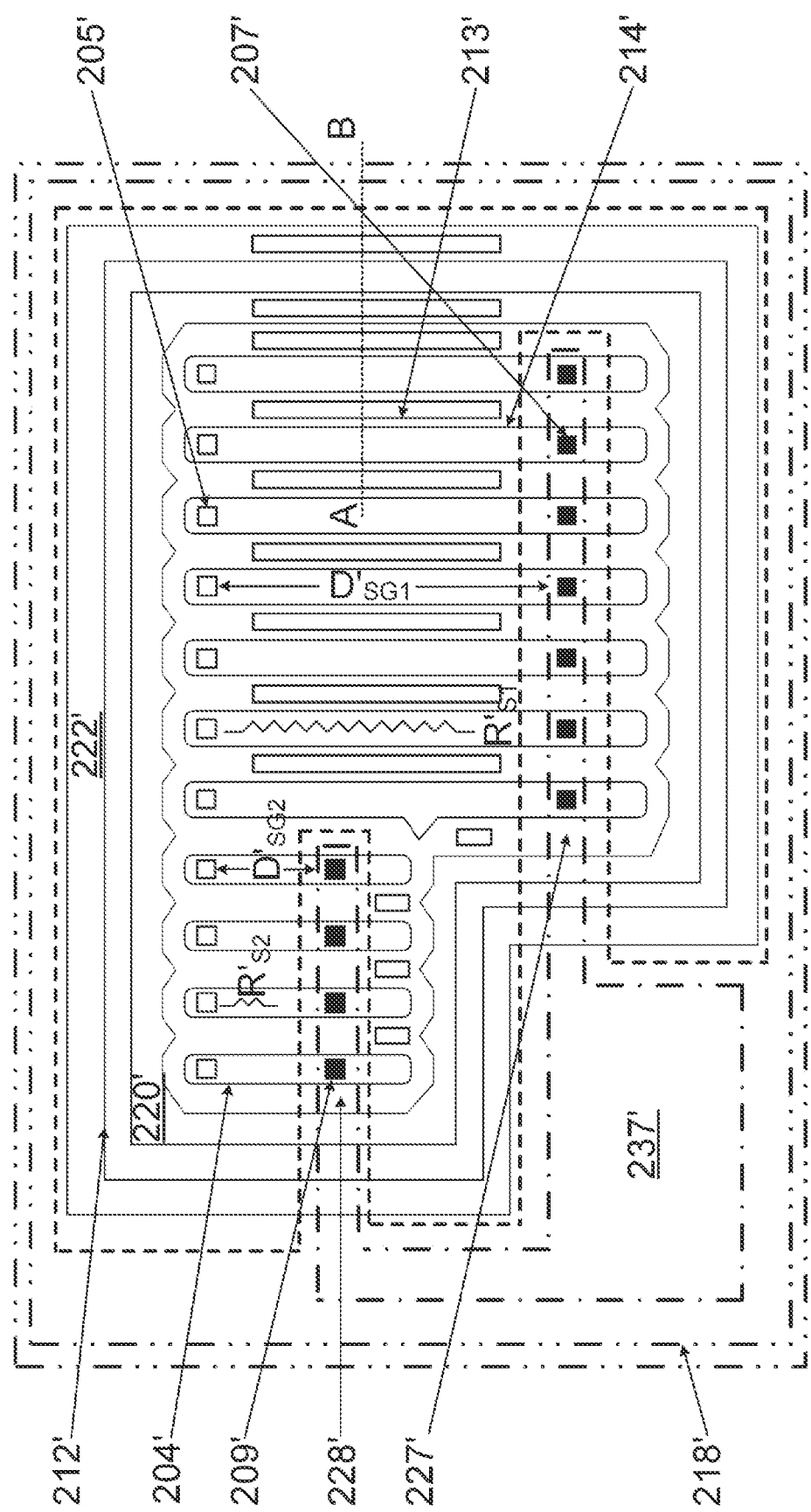
FIG. 2B is a top view of another preferred embodiment for a SGT MOSFET according to the present invention.

Please refer to FIG. 2B for a top view of another preferred embodiment for a SGT semiconductor power device according to the present invention, wherein the SGT semiconductor power device comprises an active area, a termination area, a gate metal pad area 237' and two gate metal runners 227' and 228'. The semiconductor power device has a similar structure to FIG. 2A, except that, in FIG. 2B, only one top shielded gate trench contact 205' is formed in each of the first type active gate trenches 214' and the second type active gate trenches 204'. Besides, the shielded gate spreading resistance R's1 and R's2 in FIG. 2B are two times of Rs1 and Rs2 in FIG. 2A as a result of removing the bottom shielded gate trench contacts 206 in FIG. 2A for further reducing the recovery charge Qrr and the switching voltage Vsw in high frequency applications. The top shielded gate trench contacts 205' are spaced apart from the gate metal runners 227' and 228' with a distance ($D'_{SG1}$ and $D'_{SG2}$, as illustrated) ranging from 100 um to 3000 um so that the shielded gate spreading resistance R's1 and R's2 are higher than 0.2 ohm and below 2.0 ohm for the AC performance improvement without causing BV instability issue.

Figure 3A:
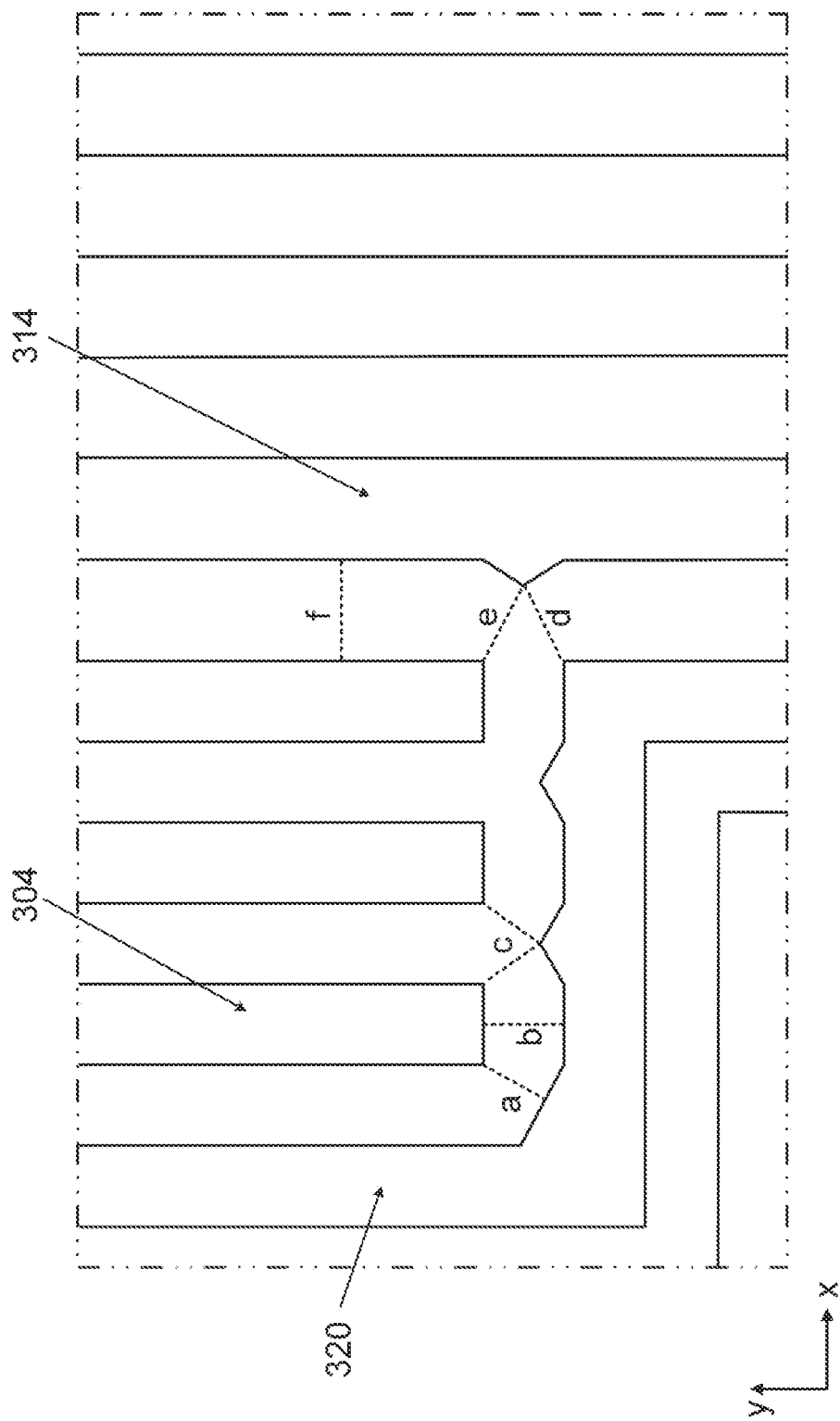
FIG. 3A is a top view showing a preferred termination trench structure of FIG. 2A according to the present invention

Please refer to FIG. 3A for a top view showing a preferred termination trench structure of FIG. 2A according to the present invention, wherein each of the first type active trenches 314 and the second type active trenches 304 has a rectangle shape. Inner edge of the first termination trench 320 has a truncated corner at intersection of the first direction (the y reference direction) and the second direction (the x reference direction), wherein a 1st distance (a, as illustrated) between trench end corner of the second type active trench 304 and the truncated corner is substantially same as a 2nd distance (b, as illustrated) between the second type active trench end and bottom of the wave shape portions and a 3rd distance (c, as illustrated) between trench end corners of the second type gate trenches 304 and peaks of the wave shape portions and a 4th distance (d, as illustrated) between peaks of the wave shape portions on inner edge of the first type active trench 314 and a trench corner of the first termination trench 320 near the gate metal pad area and a 5th distance (e, as illustrated) between peaks of the wave shape portions on inner edge of the first type active trench 314 and a trench end corner of the second type active trench 304 near the gate metal pad area, and the 1st distance is equal to or less than a 6th distance (f, as illustrated) between two adjacent of the gate trenches.

Figure 3B:
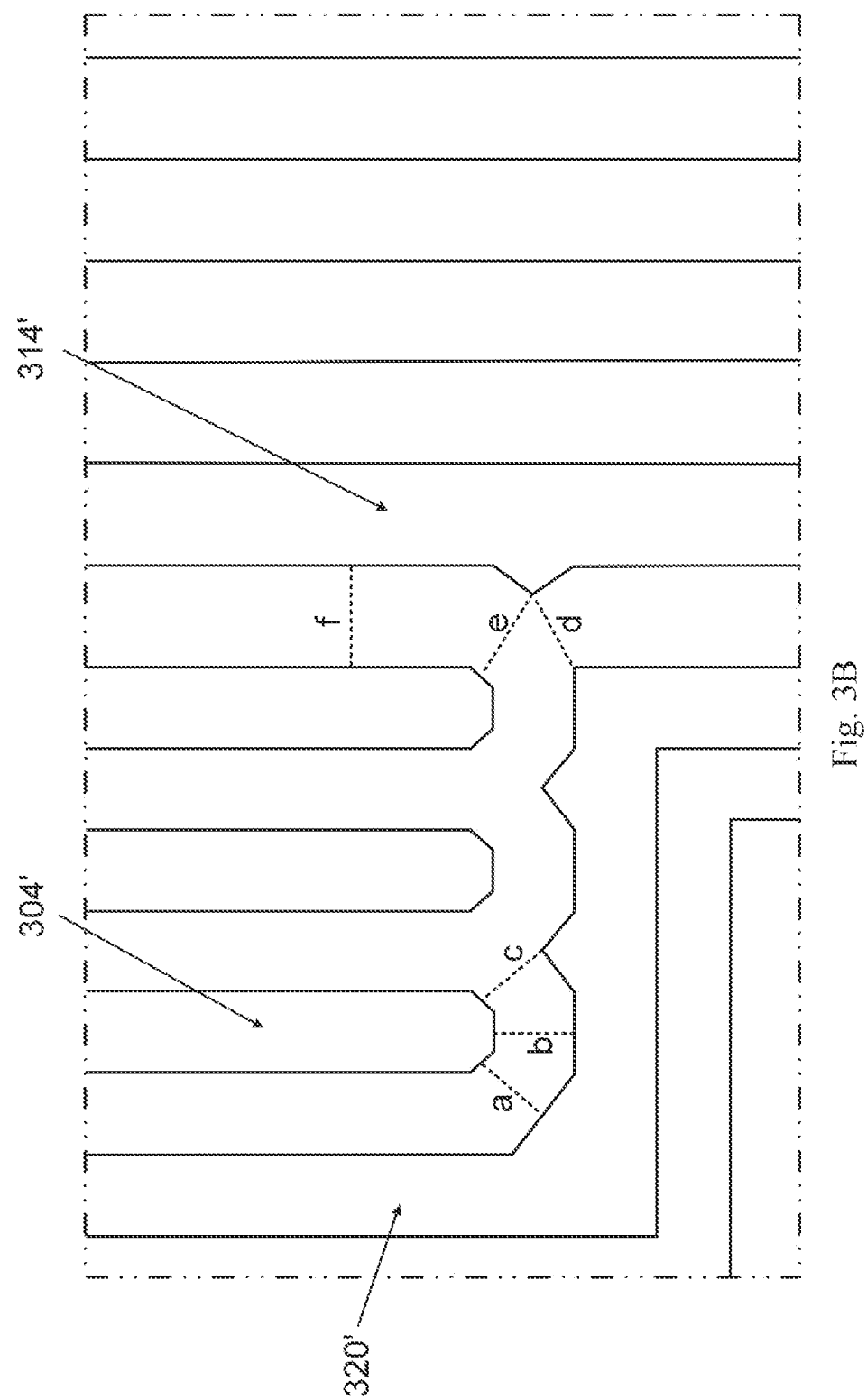
FIG. 3B is a top view showing another preferred termination trench structure of FIG. 2A according to the present invention.

Please refer to FIG. 3B for a top view showing another preferred termination trench structure of FIG. 2A according to the present invention. The semiconductor power device has a similar structure to FIG. 3A, except that in FIG. 3B, each of the second type active trenches 304' has a stripe shape with truncated corners.

Figure 3C:
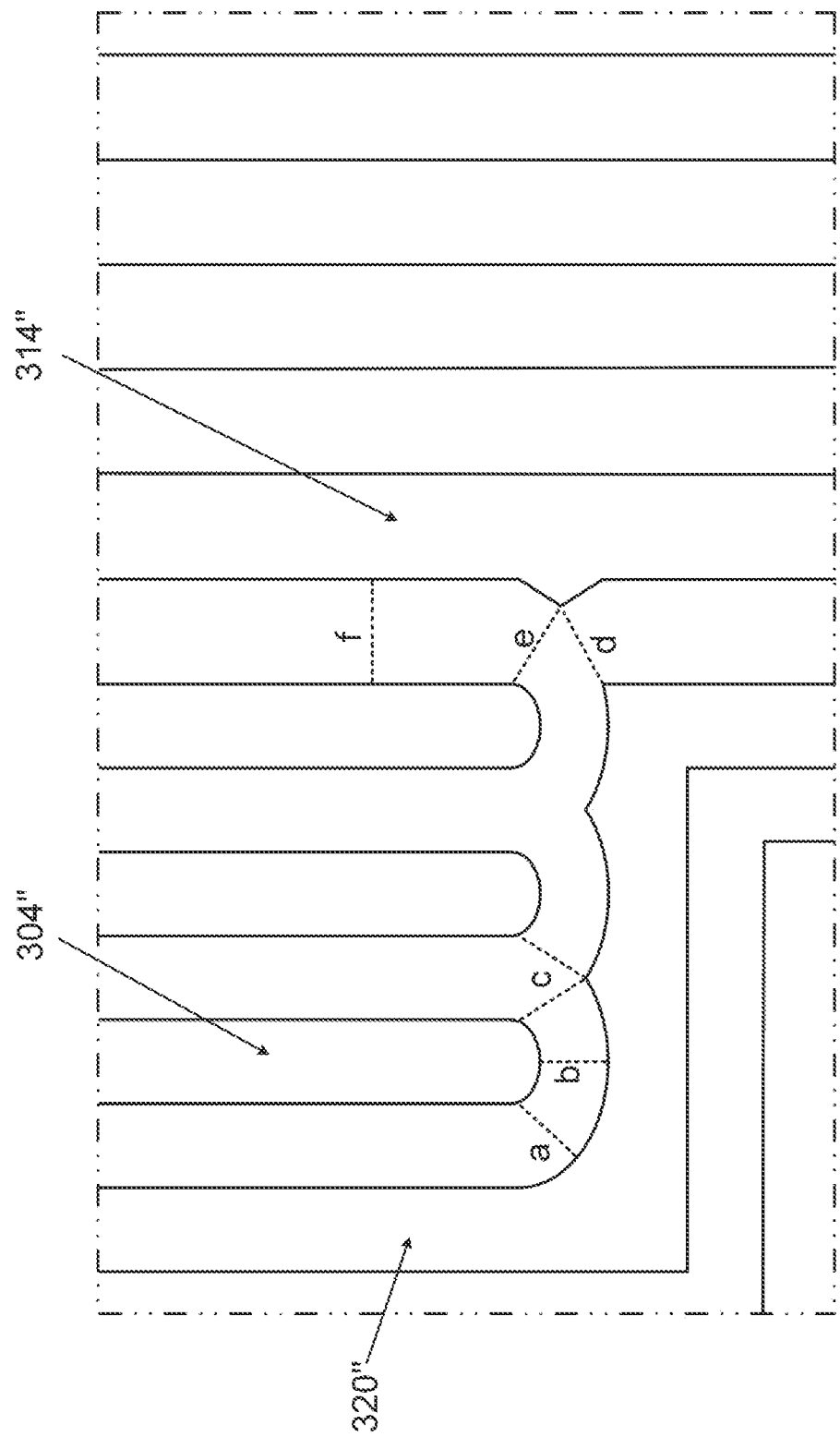
FIG. 3C is a top view showing another preferred termination trench structure of FIG. 2A according to the present invention.

Please refer to FIG. 3C for a top view showing another preferred termination trench structure of FIG. 2A according to the present invention. The semiconductor power device has a similar structure to FIG. 3A, except that in FIG. 3C, each of the second type gate trenches 304" has a stripe shape with rounded ends.

Figure 4:
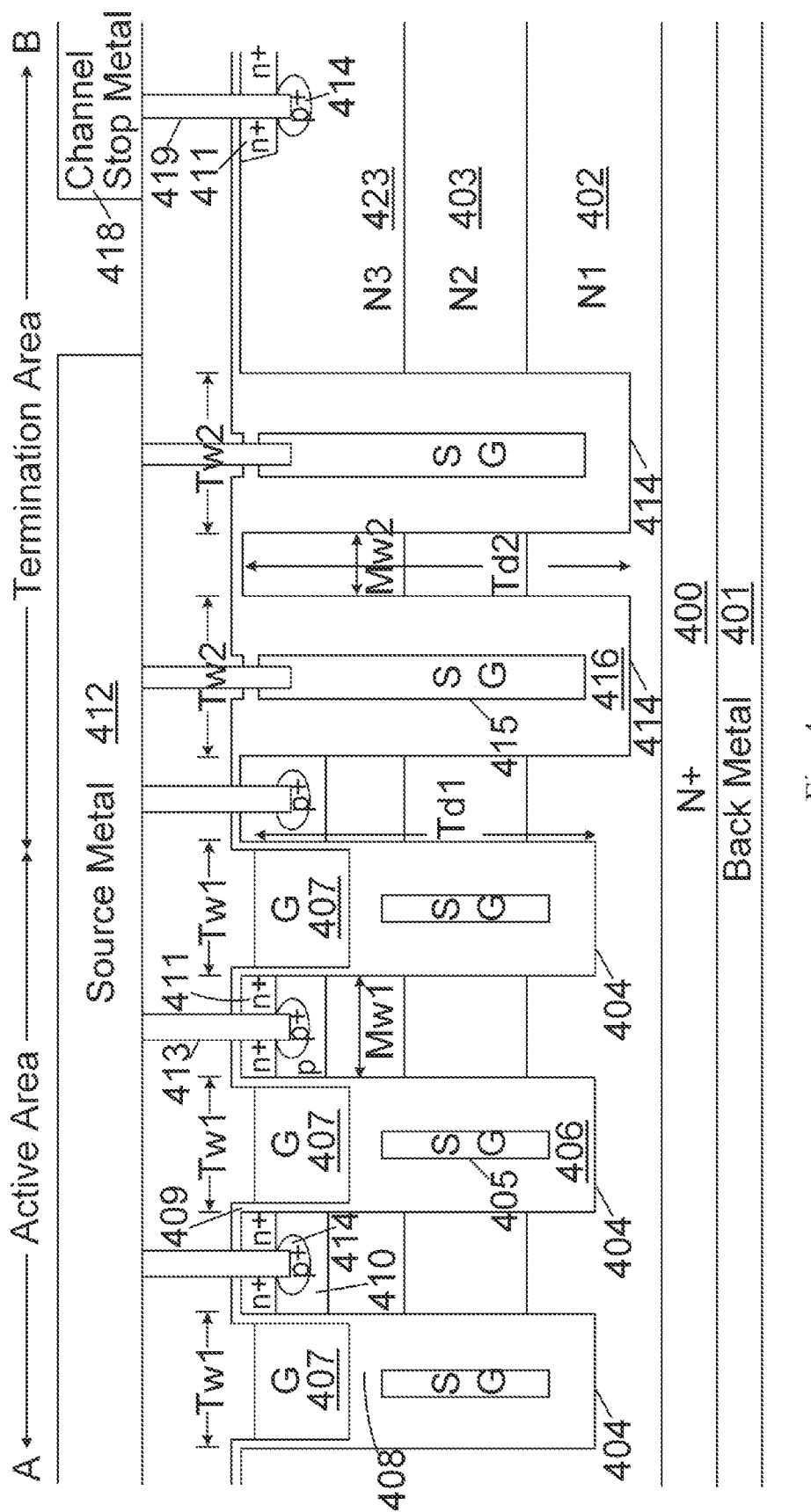
FIG. 4 is a cross-sectional view showing a preferred A-B cross section of FIG. 2A according to the present invention.

Please refer to FIG. 4 for a preferred A-B cross-sectional view of FIG. 2A, wherein the preferred embodiment of this invention comprises an active area and a termination area with three stepped epitaxial layers. The device comprises an N-channel SGT MOSFET formed in an N type epitaxial layer onto an N+ substrate 400 coated with a back metal 401 of Ti/Ni/Ag on rear side as a drain metal. The N type epitaxial layer comprises a bottom 1st epitaxial layer (N1, as illustrated) 402 with a doping concentration D1, a middle 2nd epitaxial layer (N2, as illustrated) 403 with a doping concentration D2 and a top 3rd epitaxial layer (N3, as illustrated) 423 with a doping concentration D3, wherein D3<D2<D1, to increase the breakdown voltage and lower the specific on-resistance. Inside the N type epitaxial layer, a plurality of gate trenches 404 in an active area and edge trenches 414 in a termination area are formed extending from a top surface of the 3rd epitaxial layer 423 and vertically downward into the 1st epitaxial layer 402, wherein trench bottoms of the gate trenches 404 and edge trenches 414 are above a common interface between the N+ substrate 400 and the 1st epitaxial layer 402. Inside each of the gate trenches 404 in the active area, a shielded gate electrode (SG, as illustrated) 405 is disposed in the lower portion and a single gate electrode (G, as illustrated) 407 is disposed in the upper portion above the shielded gate electrode 405. The shielded gate electrode 405 is insulated from the adjacent epitaxial layer by a first insulating film 406, and the gate electrodes 407 is insulated from the adjacent epitaxial layer by a gate oxide 409, wherein the gate oxide 409 has a thinner thickness than the first insulating film 406 which has uniform thickness along trench sidewalls, meanwhile, the shielded gate electrode 405 and the gate electrode 407 is insulated from each other by an IPO film 408. Between every two adjacent gate trenches 404, the P body regions 410 with n+ source regions 411 thereon are extending near top surface of the top 3rd epitaxial layer 423. The P body regions 410, the n+ source regions 411 and the shielded gate electrodes 405 are further shorted together to a source metal 412 through a plurality of trenched contacts 413 filled with contact plugs and barriers implemented by penetrating through a contact insulating layer 417 and surrounded by p+ heavily doped regions 414 around bottoms underneath the n+ source regions 411. In the 3rd epitaxial layer 423, outside the edge of the active area including the termination area, a p+ body contact doped region 414 is formed surrounding at least bottom of the trenched source-body contact 413 without n+ source region 411. The source regions 411 and the body regions in the active area are not disposed between two adjacent of the edge trenches 414 in the termination area. Inside each of the edge trenches 414, a trench field plate 415 is disposed and insulated from the adjacent epitaxial layer by a second insulating film 416, wherein the trench width Tw2 of the edge trench 414 is greater than or equal to the trench width Tw1 of the gate trench 404 in the active area (Tw2≥Tw1), and the trench depth Td2 of the edge trench 414 is greater than or equal to the trench depth Td1 of the gate trench 404 in the active area (Td2≥Td1). The mesa width between two adjacent of the gate trenches 404 is equal to or larger than that between two adjacent of the edge trenches 414 (Tw1≥Mw2). Moreover, in the termination area, a channel stop metal 418 is connected with the n+ source region 411, the 3rd epitaxial layer (N3, as illustrated) 423, and a p+ body contact doped region 414 through a trenched channel stop contact 419.

Figure 5:
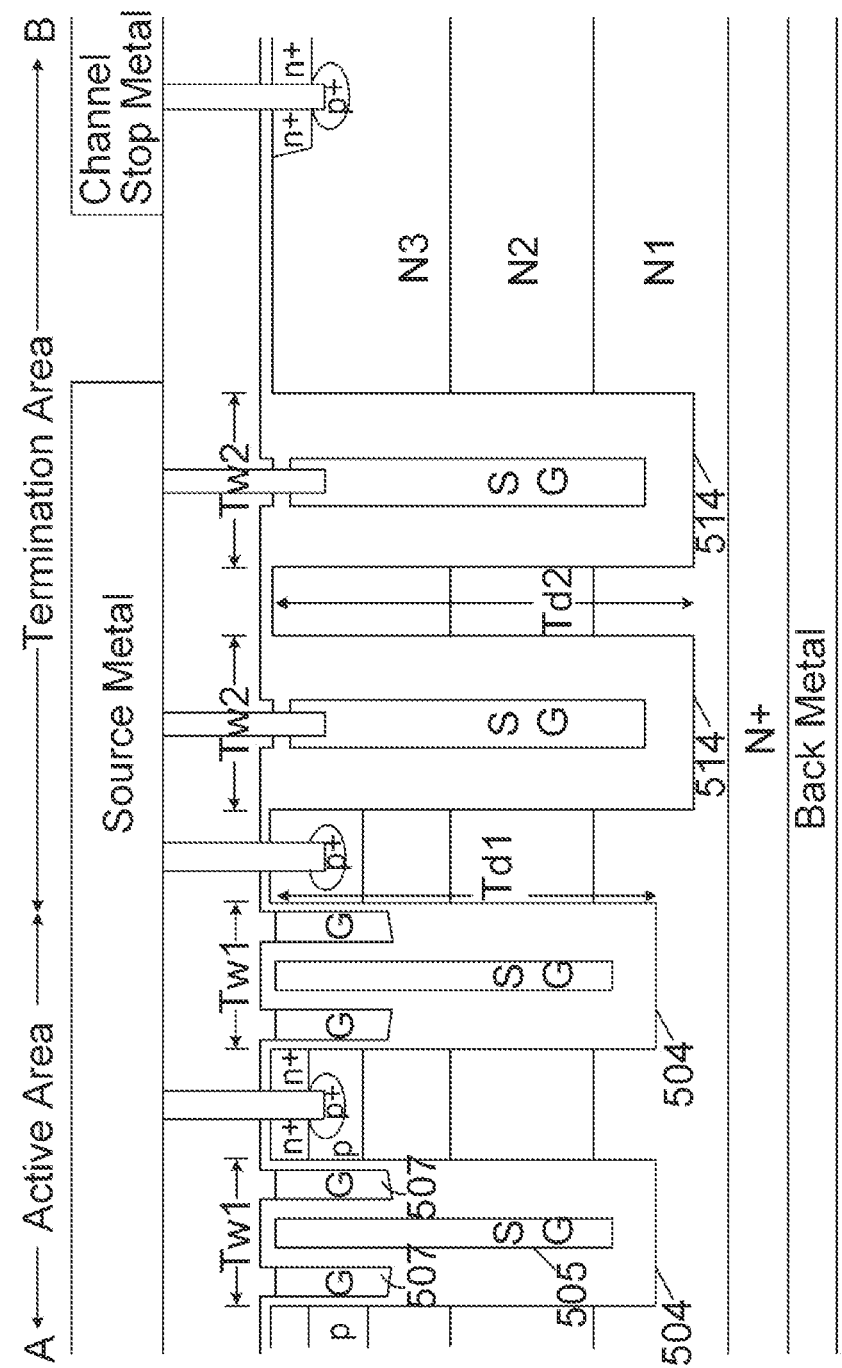
FIG. 5 is a cross-sectional view showing another preferred A-B cross section of FIG. 2A according to the present invention.

Please refer to FIG. 5 for another A-B cross-sectional view of FIG. 2A, wherein the preferred embodiment of this invention comprises an active area and a termination area with three stepped epitaxial layers. The SGT trenched semiconductor power device has a similar structure to FIG. 4, except for the different shielded gate structure in the gate trenches 504 in the active area. Inside each of the gate trenches 504, a shielded gate electrode (SG, as illustrated) 505 is disposed in the middle and gate electrode (G, as illustrated) 507 is disposed surrounding upper portions of the shielded electrode 505.

Figure 6:
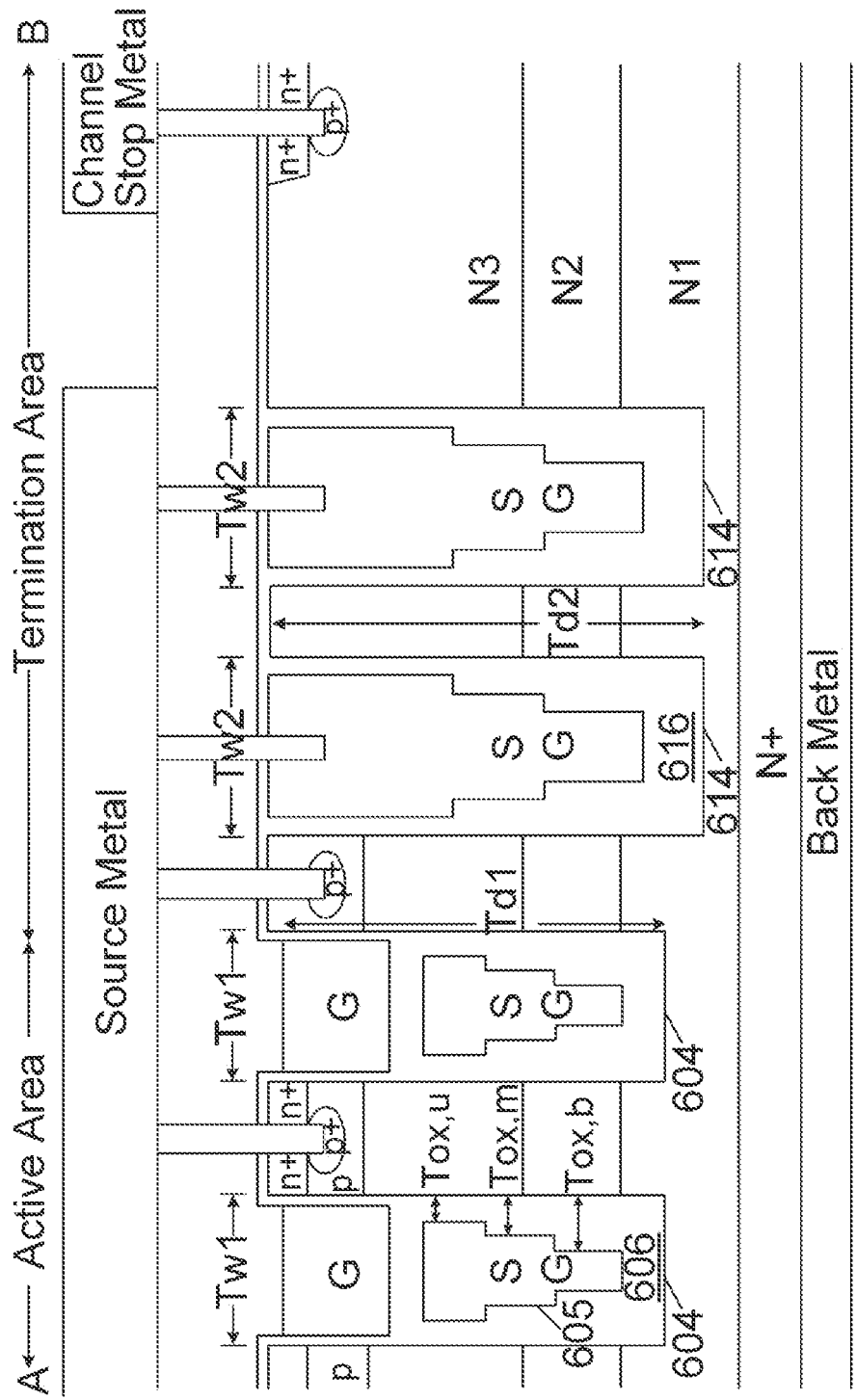
FIG. 6 is a cross-sectional view showing another preferred A-B cross section of FIG. 2A according to the present invention.

Please refer to FIG. 6 for another A-B cross-sectional view of FIG. 2A, wherein the preferred embodiment of this invention comprises an active area and a termination area with three stepped epitaxial layers. The N-channel trenched semiconductor power device has a similar structure to FIG. 4, except that in FIG. 6 the first insulating film 606 in a single gate trench 604 has three stepped oxide structure having a lower portion oxide along lower portion sidewalls and bottom of the gate trenches 604 with a uniform first thickness Tox,b, a middle portion oxide with a uniform second thickness Tox,m, and an upper portion oxide with a uniform third thickness Tox,u, where Tox,b is greater than Tox,m, and Tox,m is greater than Tox,u, to further reduce the on-resistance while maintaining the same breakdown voltage. The Tox,m can be an average of Tox,b and Tox,u. The second insulating film 616 in a single edge trench 614 has similar three stepped oxide structure as the first insulating film 606.

Figure 7:
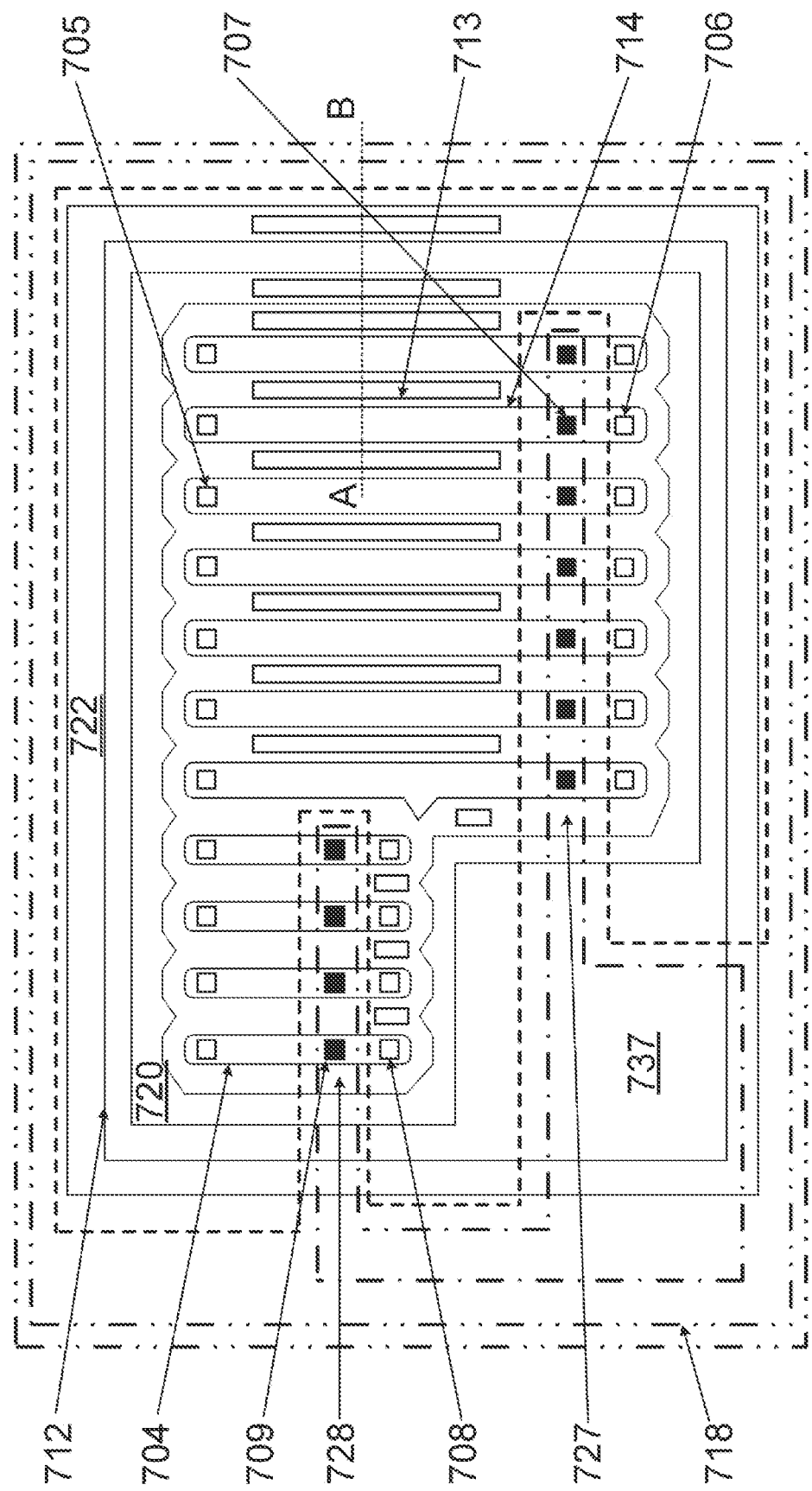
FIG. 7 is a top view of another preferred embodiment for a SGT semiconductor power device according to the present invention.

Please refer to FIG. 7 for a top view of another preferred embodiment for a SGT semiconductor power device according to the present invention, wherein the SGT semiconductor power device comprises an active area, a termination area and a gate metal pad area. The semiconductor power device has a similar structure to FIG. 2A, except that, there are two type termination trenches; at least one first type termination trench 720 surrounding outer periphery of gate trenches 704 and 714 but does not surround a gate metal pad area 737; and at least one second type termination trench 722 surrounding the first type termination trench 720 and at least a portion of said gate metal pad area.

Figure 8:
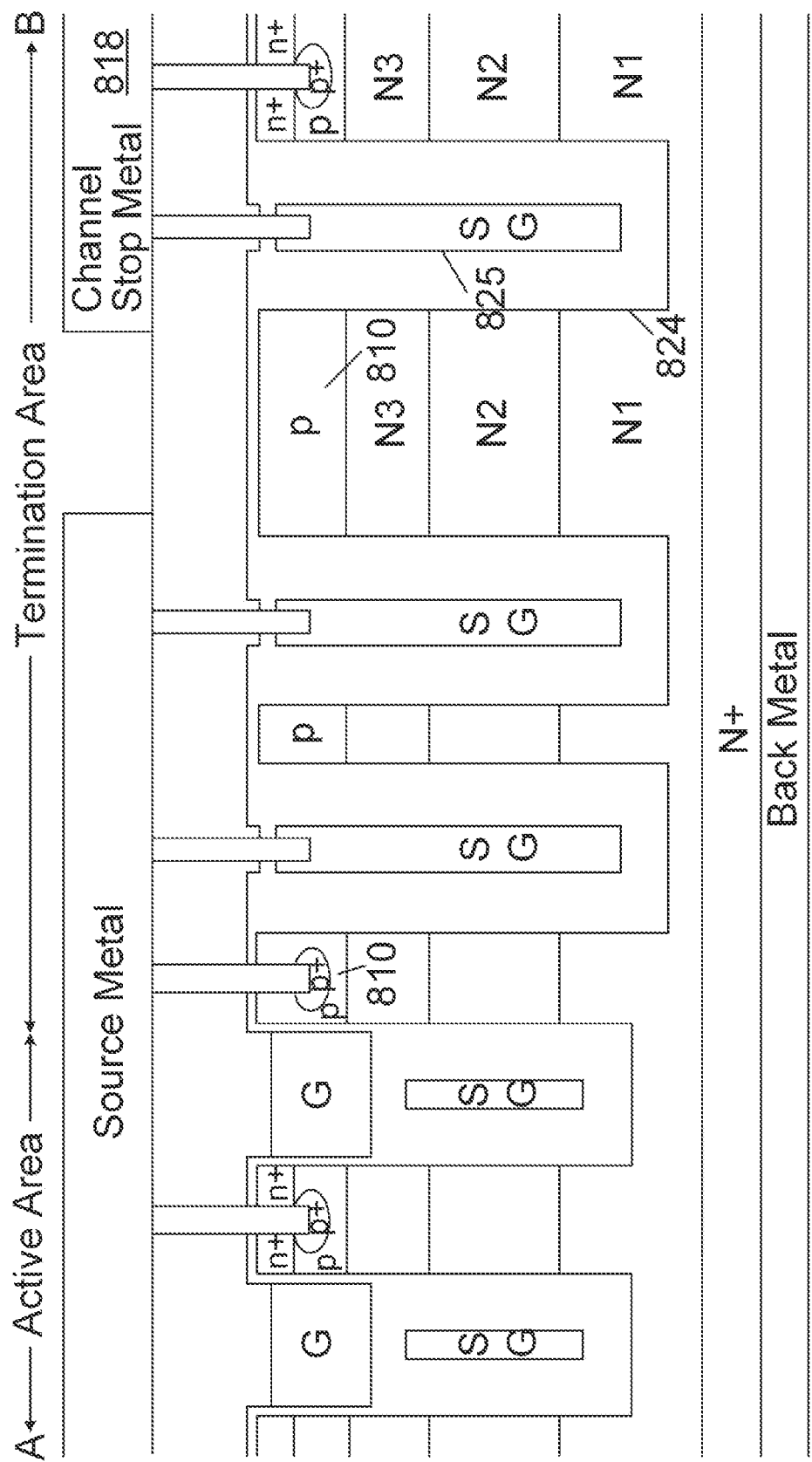
FIG. 8 is a cross-sectional view showing another preferred A-B cross section of FIG. 2A according to the present invention.

Please refer to FIG. 8 for another A-B cross-sectional view of FIG. 2A, wherein the preferred embodiment of this invention comprises an active area and a termination area. The SGT trenched semiconductor power device has a similar structure to FIG. 4, except FIG. 8 has a channel stop field plate 825 inside a channel stop trench 824 under channel stop metal and a P body region 810 in the active area and the termination area.

Figure 9:
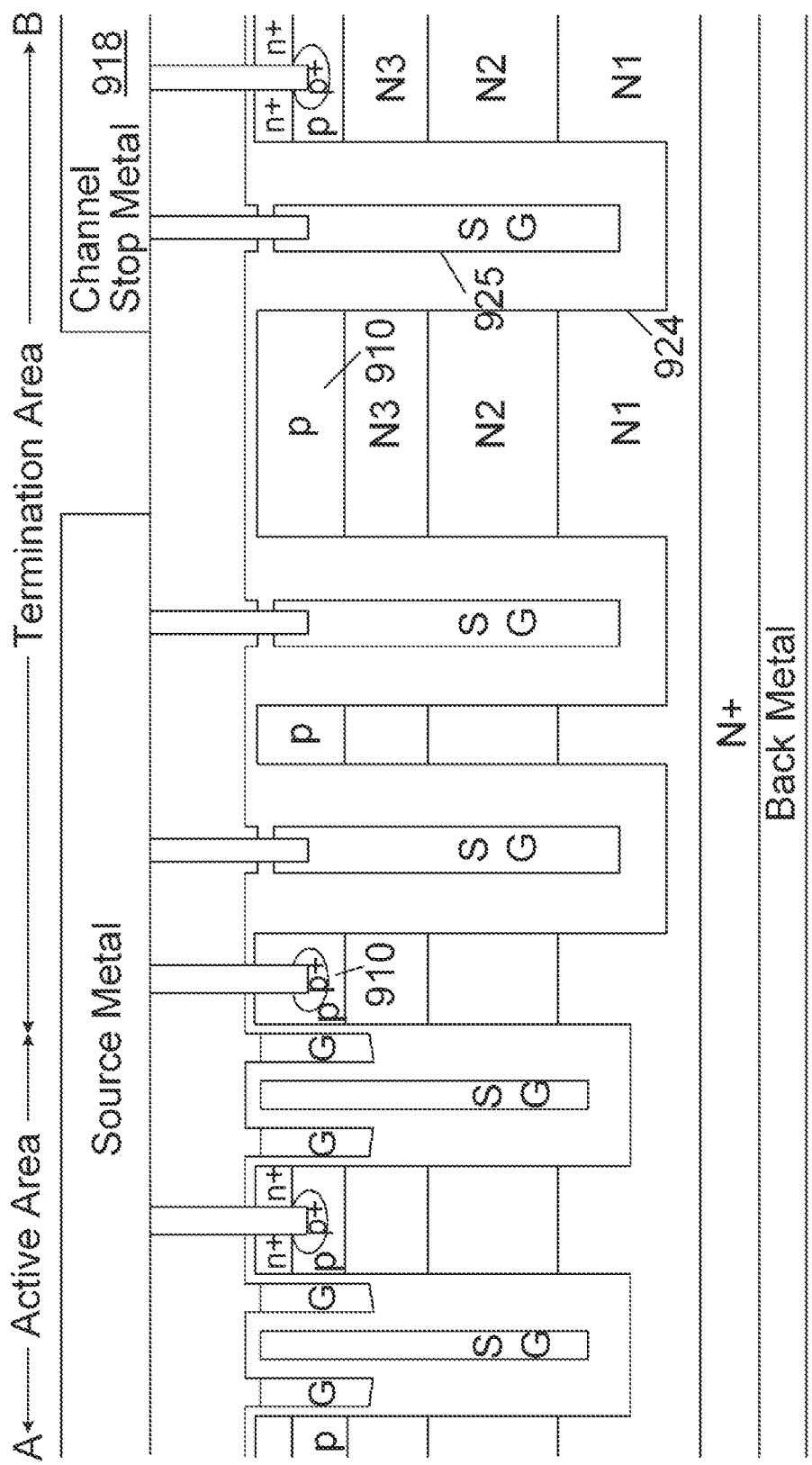
FIG. 9 is a cross-sectional view showing another preferred A-B cross section of FIG. 2A according to the present invention.

Please refer to FIG. 9 for another A-B cross-sectional view of FIG. 2A, wherein the preferred embodiment of this invention comprises an active area and a termination area. The SGT trenched semiconductor power device has a similar structure to FIG. 5, except FIG. 8 has a channel stop field plate 925 inside a channel stop trench 924 under channel stop metal and a P body region 910 in the active area and the termination area.

Figure 10:
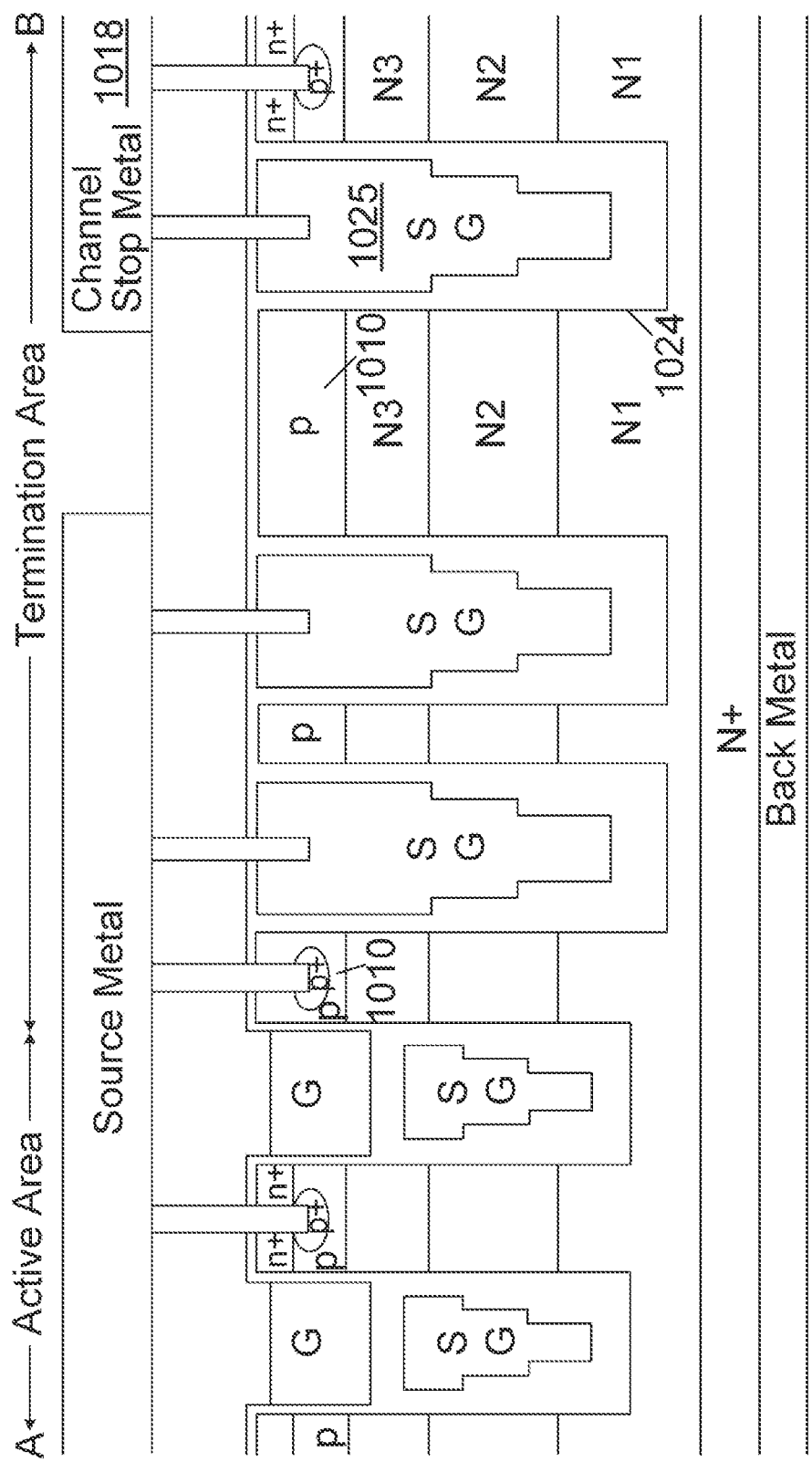
FIG. 10 is a cross-sectional view showing another preferred A-B cross section of FIG. 2A according to the present invention.

Please refer to FIG. 10 for another A-B cross-sectional view of FIG. 2A, wherein the preferred embodiment of this invention comprises an active area and a termination area. The SGT trenched semiconductor power device has a similar structure to FIG. 6, except FIG. 10 has a channel stop field plate 1025 inside a channel stop trench 1024 under channel stop metal and a P body region 1010 in the active area and the termination area.

Although the present invention has been described in terms of the presently preferred embodiments, it is to be understood that such disclosure is not to be interpreted as limiting. The embodiments described above often show N-channel devices, the embodiments can also be applied to P-channels devices by reversing the polarities of the conductivity types. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A shielded gate trench (SGT) device comprising:
an active area, a termination area, a gate metal pad area and at least one gate metal runner;
said active area comprising a plurality of gate trenches formed in an epitaxial layer of a first conductivity type onto a substrate of said first conductivity type along a first axis including a first type active trenches having a first active trench length, and a second type active trenches near the gate pad area having a second active trench length, wherein said first active trench length is longer than the second active trench length;
said termination area comprising at least one first type termination trench surrounding outer periphery of said plurality of gate trenches in a first direction along said first axis and in a second direction along a second axis wherein said first axis is vertical to said second axis, and said at least one first type termination trench is separated from said plurality of gate trenches and does not surround said gate metal pad area;
an inner edge of a first termination trench of said termination trenches along said second axis adjacent to trench ends of said plurality of gate trenches has a plurality of wave shape portions in regions between two adjacent trench ends of said plurality of gate trenches while outer edges have a straight shape, and inner and outer edges of other said termination trenches have a straight shape;
said first type active trench near said gate metal pad area has at least one wave shape portion in a region between a trench end of said second type active trench adjacent to said first type active trench and said first termination trench near one corner of said gate metal pad area;
said SGT device further comprising:
said gate trenches are formed in said active area, surrounded by a first type source regions of a first conductivity type are encompassed in a first type body regions of a second conductivity type near a top surface of said epitaxial layer of said first conductivity type, each of said gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an (Inter-Poly Oxide) IPO film, said gate oxide surrounds said gate electrode and has less thickness than said first insulating film;
a termination trench field plate is disposed in each of said termination trenches in said termination area and insulated from said epitaxial layer by a second insulating film, wherein each of said termination trenches has a trench width and a trench depth greater than or equal to said each of said gate trenches in said active area;
said termination trench field plate is shorted together with said first type source and said first type body regions through a source metal;
said gate electrode inside each of said gate trenches is connected to said gate metal pad through said at least one gate metal runner having a plurality of gate trench contacts underneath; and
said shielded gate electrode inside each of said plurality of gate trenches is connected to a source metal through at least one shielded gate trench contact.

2. The SGT device of claim 1, wherein said epitaxial layer has multiple stepped epitaxial layers with doping concentration decreasing stepwise in a direction from bottoms of said plurality of gate trenches toward said first type body regions along sidewalls of said gate trenches.

3. The SGT device of claim 1, further comprising a channel stop region in said termination area with a second type source region same as said first type source regions in said active area, shorted together with said epitaxial layer underneath a channel stop metal, and said none of said first type body regions in said active area exists between two adjacent said termination trenches.

4. The SGT device of claim 1, further comprising a second type body regions in said termination area which are same as said first type body regions in said active area, and a channel stop field plate disposed in a channel stop trench under a channel stop metal shorted together with one of said second type body regions.

5. The SGT device of claim 1, wherein said gate electrode is disposed above said shielded gate electrode inside each of said plurality of gate trenches.

6. The SGT device of claim 1, wherein said shielded gate electrode is disposed in the middle and said gate electrode is disposed surrounding upper portion of said shielded electrode.

7. The SGT device of claim 1, wherein said wave shape portions have one of triangle or rectangle or semicircle like shapes.

8. The SGT device of claim 1, wherein each of said gate trenches has a rectangle shape.

9. The SGT device of claim 1, wherein each of said gate trenches has a stripe shape with truncated corners.

10. The SGT device of claim 1, wherein each of said gate trenches has a stripe shape with rounded ends.

11. The SGT device of claim 1, wherein a first distance between trench end corners of said gate trenches and peaks of said wave shape portions are substantially same as a second distance between said trench ends of said gate trenches and bottoms of said wave shape portions, and said first distance is equal to or less than third distance between two adjacent of said gate trenches.

12. The SGT device of claim 1, wherein a first distance between peaks of said wave shape portions on inner edge of said first type active trench and a trench end corner of said second type active trench near said gate metal pad area, is substantially same as a second distance between peaks of said wave shape portions on inner edge of said first type active trench and a trench corner of said first termination trench near said gate metal pad area, and said first distance is equal to or less than third distance between two adjacent of said gate trenches.

13. The SGT device of claim 1, wherein said inner edge of termination trench has a truncated corner at intersection of said first direction and said second direction, wherein a first distance between trench end corner of said gate trenches and said truncated corner is substantially same as a second distance between said trench end and bottom of said wave shape portions, and said first distance is equal to or less than third distance between two adjacent of said gate trenches.

14. The SGT device of claim 1, wherein said first insulating film is a single oxide film having uniform thickness.

15. The SGT device of claim 1, wherein said first insulating film has multiple stepped oxide structure with thickness decreasing stepwise in a direction from bottoms of said plurality of gate trenches toward said first type body regions along sidewalls of said gate trenches.

16. The SGT device of claim 1, wherein said termination area further comprising at least one second type termination trench surrounding said at least one first type termination trench and at least a portion of said gate metal pad area.

17. A shielded gate trench (SGT) device comprising:
an active area, a termination area, a gate metal pad area and at least one gate metal runner;
said active area comprising a plurality of gate trenches formed in an epitaxial layer of a first conductivity type onto a substrate of said first conductivity type along a first axis including a first type active trench having a first active trench length, and a second type active trench near the gate pad area having a second active trench length, wherein said first active trench length is longer than the second active trench length;
said termination area comprising at least one termination trench surrounding outer periphery of said gate trenches in a first direction along said first axis and in a second direction along a second axis wherein said first axis is vertical to said second axis, and said at least one termination trench is separated from said gate trenches and does not surround said gate metal pad area;
said plurality of gate trenches are formed in said active area, surrounded by source regions of a first conductivity type are encompassed in body regions of a second conductivity type near a top surface of said epitaxial layer of said first conductivity type, each of said gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an (Inter-Poly Oxide) IPO film, said gate oxide surrounds said gate electrode and has less thickness than said first insulating film; and
said gate electrode inside each of said gate trenches is connected to said gate metal pad through said at least one gate metal runner having a plurality of gate trench contacts underneath; and
said shielded gate electrode inside each of said gate trenches is connected to a source metal through at least one shielded gate trench contact which is spaced apart from said at least one gate metal runner with a distance ranging from 100 um to 3000 um.

18. The SGT device of claim 17, wherein said gate electrode is disposed above said shielded gate electrode inside each of said plurality of gate trenches.

19. The SGT device of claim 17, wherein said shielded gate electrode is disposed in the middle and said gate electrode is disposed surrounding upper portion of said shielded gate electrode.

20. The SGT device of claim 17, wherein a shielded gate spreading resistance exists between said at least one shielded gate trench contact to said at least one gate metal runner ranging from 0.2 ohm to 2.0 ohm.

* * * * *